United States Patent
Roy et al.

(10) Patent No.: US 9,595,329 B1
(45) Date of Patent: Mar. 14, 2017

(54) NON-VOLATILE RANDOM ACCESS MEMORY (NVRAM) WITH BACKUP CONTROL

(71) Applicant: FREESCALE SEMICONDUCTOR, INC., Austin, TX (US)

(72) Inventors: Anirban Roy, Austin, TX (US); Michael A. Sadd, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/885,688

(22) Filed: Oct. 16, 2015

(51) Int. Cl.
*G11C 14/00* (2006.01)
*G11C 5/06* (2006.01)
*G11C 5/14* (2006.01)
*G11C 11/406* (2006.01)

(52) U.S. Cl.
CPC ............ *G11C 14/0045* (2013.01); *G11C 5/06* (2013.01); *G11C 5/148* (2013.01); *G11C 11/406* (2013.01); *G11C 14/00* (2013.01)

(58) Field of Classification Search
CPC . G11C 14/0045; G11C 14/0009; G11C 14/00; G11C 14/0054; G11C 14/009
USPC .................................................. 365/148, 228
See application file for complete search history.

(56) References Cited

U.S. PATENT DOCUMENTS

| 6,178,479 | B1 | 1/2001 | Vishin |
| 2007/0180187 | A1 | 8/2007 | Olson et al. |
| 2009/0077307 | A1 | 3/2009 | Kaburlasos et al. |
| 2012/0320658 | A1* | 12/2012 | Wang ................. G11C 14/0054 365/148 |
| 2013/0166932 | A1* | 6/2013 | Iarovici ................. G06F 1/3206 713/323 |

OTHER PUBLICATIONS

Abe et al, "Novel Hybrid DRAM/MRAM Design for Reducing Power of High Performance Mobile CPU", IEEE International Electron Devices Meeting (IEDM), Dec. 10-13, 2012, pp. 10.5.1-10.5.4.
Nair et al, "A case for Refresh Pausing in DRAM memory systems", International Symposium on High Performance Computer Architecture (HPCA2013), Feb. 23-27, 2013, pp. 627-638.
Kazi et al, "A Re-RAM-based non-volatile flip-flop with sub-VT read and CMOS voltage-compatible write", International New Circuits and Systems Conference (NEWCAS), Jun. 16-19, 2013, pp. 1-4.

* cited by examiner

*Primary Examiner* — Amir Zarabian
*Assistant Examiner* — Jay Radke

(57) ABSTRACT

A memory system has a first plurality of non-volatile random access memory (NVRAM) cells. Each NVRAM cell has a volatile portion coupled to a corresponding non-volatile portion. A non-volatile indicator circuit provides information as to whether the first plurality of NVRAM cells has the most recent data written into NVRAM cells in the non-volatile portions.

16 Claims, 2 Drawing Sheets

NON-VOLATILE RANDOM ACCESS MEMORY (NVRAM) WITH BACKUP CONTROL

BACKGROUND

Field

This disclosure relates generally to integrated circuits, and more particularly, to non-volatile random access memories (NVRAMs).

Related Art

Non-volatile memories (NVMs) have become very important in a variety of applications but typically have characteristics that make them difficult to use as a random access memory. Some of the difficulties are very slow program and erase times, inability to erase one bit at a time, and high voltage requirements for program and erase. Some of the resistive NVMs, such as magnetic tunnel junctions (MTJs) alleviate these difficulties to some extent but are not a complete replacement for volatile RAMs such as DRAMs and SRAMs. Accordingly there are applications now where a memory cell itself has both a RAM portion, which may be SRAM or DRAM, and a non-volatile (NV) portion. This allows for both high speed operation while also being non-volatile. There are nonetheless difficulties relating to differences in operating characteristics between the NV and volatile portions such as write speeds that, although much faster than floating gate type NV memory cells, are slower and require more power than RAMs.

Accordingly there is a need to provide further improvement in obtaining NVRAMs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

Shown in FIG. 1 is a block diagram of a memory system including a NVRAM; and

Figure 1:
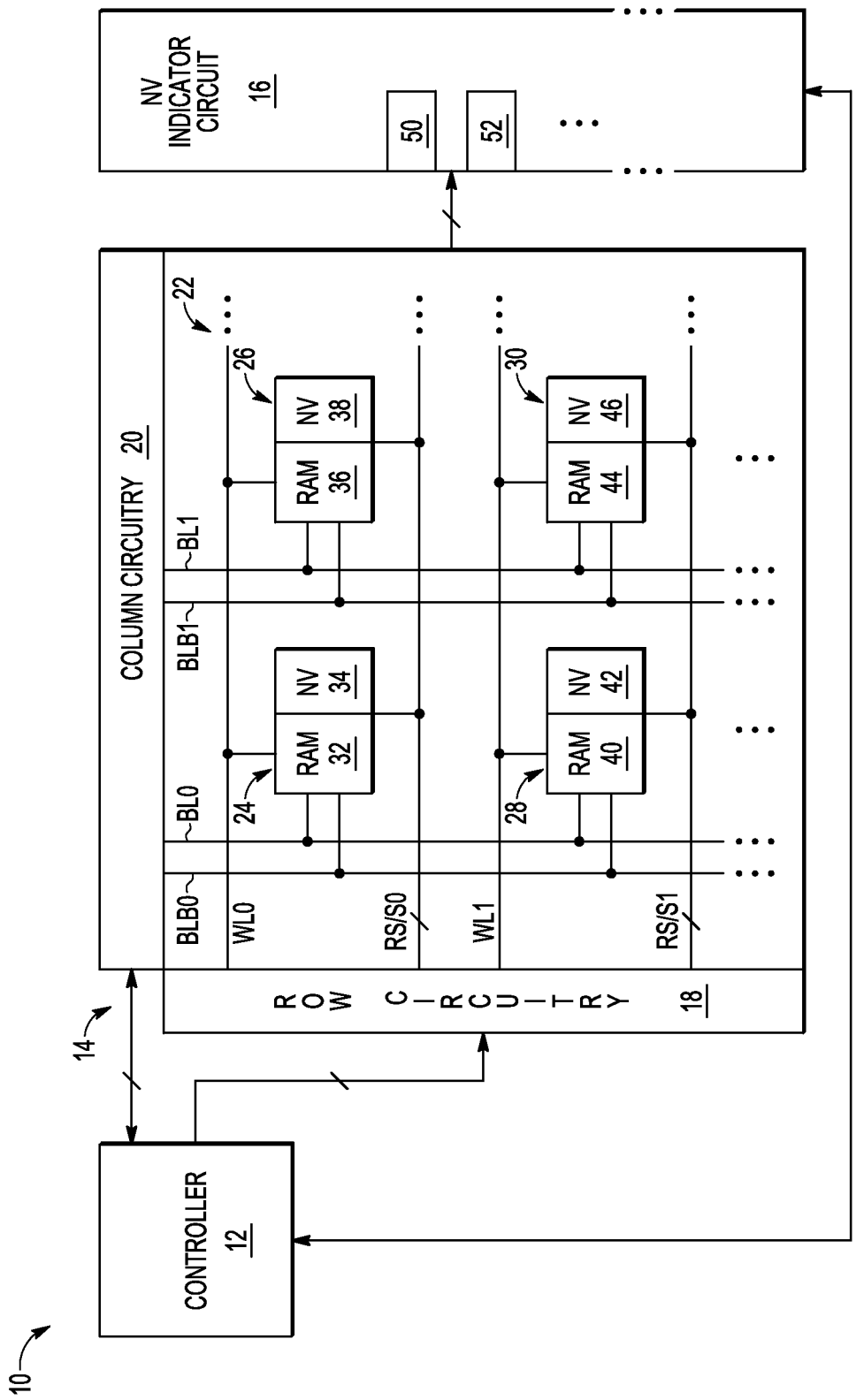
Figure 2:
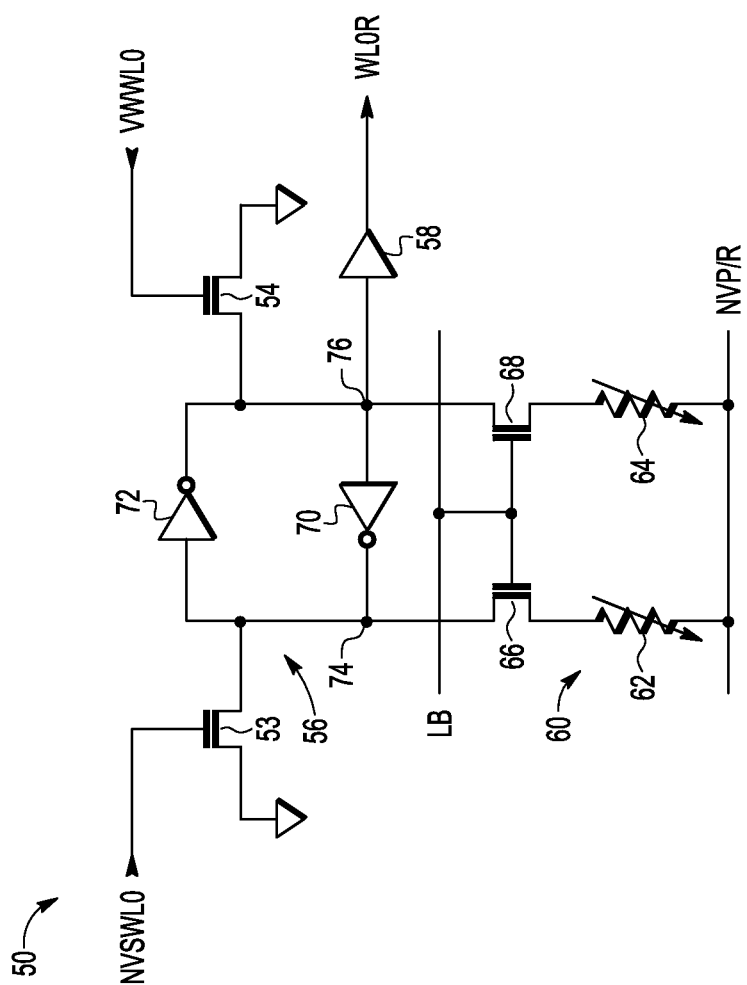

Shown in FIG. 2 is a circuit diagram of a portion of the memory system of FIG. 1.

DETAILED DESCRIPTION

In one aspect, a NVRAM cell has a volatile portion and a non-volatile (NV) portion in which the volatile portion has data that may not have been written into the NV portion. A NV indicator circuit keeps track of this situation and can provide for the transfer of the data in response to a situation, such as power-down, where it is desired for this transfer to occur. This is better understood by reference to the drawings and the following written description.

Shown in FIG. 1 a memory system 10 having a controller 12, a NVRAM 14, and a NV indicator circuit 16 coupled to controller 12 and NVRAM 14. NVRAM 14 has row circuitry coupled to controller 12, column circuitry coupled to controller 12, and an array 22 coupled to column circuitry 20 and row circuitry 18. Array 22 has a plurality of NVRAM cells including NVRAM cells 24, 26, 28, and 30, has a plurality of word lines including a word line WL0 and a word line WL1, and a plurality of bit line pairs including a bit line pair having bit line BL0 and complementary bit line BLB0 and a bit line pair having bit line BL1 and complementary bit line BLB1. NVRAM cell 24 has a RAM portion 32 and a NV portion 34. NVRAM cell 26 has a RAM portion 36 and a NV portion 38. NVRAM cell 28 has a RAM portion 40 and a NV portion 42. NVRAM cell 30 has a RAM portion 44 and a NV portion 46. RAM portions 32 and 40 are coupled to bit line BL0 and complementary bit line BLB0. RAM portions 36 and 44 are coupled to bit line BL1 and complementary bit line BLB1. RAM portions 32 and 36 are coupled to word line WL0. RAM portions 40 and 44 are coupled to word line WL1. Array 22 has plurality of restore/store lines including restore/store lines RS/R0 coupled to NVRAM cells 24 and 26 and restore/store lines RS/R1 coupled to NVRAM cells 28 and 30. NV indicator circuit 16 has a plurality of NV latches including NV latch 50 and NV latch 52. NV latch 50 corresponds to word line WL0. NV latch 52 corresponds to word line WL1. There are other NV latches in indicator circuit 16 in which there is a corresponding NV latch for each word line in NVRAM 14. NV portions 34, 38, 42, and 46 may be pairs of magnetic tunnel junctions (MTJs) with a pair of coupling transistors between the MTJs and the RAM. The RAM portion in this example may be a static RAM cell and may be referenced as a volatile portion.

Controller 12 directs the operation of NVRAM 14 using row circuitry 18 and column circuitry 20 in performing read, write, store, and restore operations on array 22. Word lines WL0 and WL1 and bit lines BL0 and BL1, and complementary bit lines BLB0 and BLB1 are used for reading and writing RAM portions 32, 36, 40 and 44. Restore/store lines RS/S0 and RS/S1 are used for transferring data between NV portions 34, 38, 42, and 46 and RAM portions 32, 36, 40 and 44, respectively, in restore and store operations. A restore operation is a transfer from the NV portion to the RAM portion. A store operation is a transfer from the RAM portion to the NV portion. NV indicator circuit 16 operates under the direction of controller 12, but also receives information directly from NVRAM 14 as to when the RAM portions of cells coupled to a word line have been written into. Controller 12 uses this information to determine when a store operation is to be performed along a word line that has been written with data that is not the same as stored in its corresponding NV portions. Controller 12 also updates NV indicator circuit 16 when a store has occurred.

Shown in FIG. 2 is a NV latch 50 having a transistor 53, a transistor 54, a latch 56, a buffer 58, and a NV portion 60. NV portion 60 has a programmable resistance 62, a NV programmable resistance 64, a transistor 66, and a transistor 68. Programmable resistances 62 and 64 together may be referenced as an indicator non-volatile portion. Transistors 66 and 68 may be referenced as a transfer circuit. Latch 56 has an inverter 70 and an inverter 72. In this implementation the transistors are N channel transistors. Transistor 53 has a control electrode for receiving a NV store word line NVSWL0, a first current electrode that functions as a source connected to a negative power supply terminal that may be ground, and a second current electrode that functions as a drain coupled to a node 74. Transistor 54 has a control electrode for receiving a volatile write word line VWWL0, a first current electrode that functions as a source connected to the negative power supply terminal, and a second current electrode that functions as a drain coupled to a node 76. Inverter 72 has an input connected to node 74 and an output connected to a node 76. Inverter 70 has an input connected to node 76 and an output connected to node 74. Buffer 58 has an input connected to node 76 and an output providing a word line register signal WL0R. Transistor 66 has a first current electrode connected to node 74, a control electrode for receiving a load backup signal LB, and a second current electrode. Transistor 68 has a first current electrode connected to node 76, a control electrode for receiving load backup signal LB, and a second current electrode. Programmable resistance 62 has a first terminal connected to the second current electrode of transistor 66 and a second terminal connected to a NV program/restore line NVP/R. Programmable resistance 64 has a first terminal connected to the second current electrode of transistor 68 and a second terminal connected to NV program/restore line NVP/R.

With NV latch 50 corresponding to word line WL0, word line register signal WL0R is a logic high to indicate that the data in RAM portions 32 and 36 are the same as the data present in NV portions 34 and 38, respectively. This information is latched into latch 56 with a logic high on node 76 and a logic low on node 74. Transistors 53 and 54 are non-conductive with NV store word line signal NVSWL0 from controller 12 and volatile write word line signal VWWL0 from NVRAM 14 both at a logic low. Load backup signal LB from controller 12 is at a logic low so that transistors 66 and 68 are non-conductive. In response to a write along word line WL0, NVRAM 14 switches volatile write word line VWWL0 to a logic high causing transistor 54 to bring node 76 to a logic low which in turn causes node 74 to switch to a logic high. Buffer 58 then provides word line register signal WL0R to a logic low to indicate that RAM portions, such as RAM portions 32 and 36, have been changed and are thereby different than the corresponding NV portions, such as NV portions 34 and 38, respectively. The state of word line register signal WL0R can be stored in NV portion 60 by controller 12 providing load backup signal LB at a logic high and NV program/read signal NVP/R at a programming voltage. In this case, the arrows through NV programmable resistances 62 and 64 point in the direction of current flow that will result in the relatively high resistance. Thus, applying NV program/restore signal NVP/R, as a positive voltage when node 76 is a logic low will result in current through programmable resistance 64 in the direction that results in a low resistance for programmable resistance 64. To ensure that programmable resistance 62 is in the relatively high resistance, NV program/restore signal NVP/R is switched to both a logic high and a logic low so that both programmable resistances 62 and 64 receive the appropriate bias. This ensures that the logic states of nodes 74 and 76 determine the resulting resistance, either relatively high or relatively low resistance, of programmable resistances 62 and 64. The operation of NVRAM 14 may continue without changing the state of NV portions 34 and 38 but word line register signal WL0R ensures that controller 12 is informed that NV portions along word line WL0 are not what is present in the corresponding RAM portions.

At such time as the controller 12 decides that the NV portions should be updated with the current state of the RAM portions, which may be in response to a scheduled power-down, controller 12 reads the state of word line register signal WL0R. If word line register signal WL0R is a logic low, which indicates that NV portions along word line WL0 includes NVRAM cells that do not contain the most recent data for that NVRAM cell, controller initiates a store operation along word line WL0 using restore/store signals RS/S0. The store operation results in the data present in the RAM portions being transferred to their corresponding NV portions. If the store operation on word line WL0 is successful, latch 56 is reset so that node 74 is set to a logic low by controller 12 asserting NV store word line signal NVSWL0 as a logic high which causes transistor 62 to become conductive and bring node 74 to a logic low which in turn causes node 76 to be a logic high. Buffer 58 then provides word line register signal WL0R at a logic high to indicate that the NV portions and their corresponding RAM portions on word line WL0 are the same. NV portion 60 can then be programmed so that programmable resistance 62 is converted to the relatively low resistance and programmable resistance 64 is converted to the relatively high resistance. At power-down, the data in the RAM portions along word line WL0 are lost but the NV portions along word line WL0 retain their state as does NV portion 60 of NV latch 50. At this point, power-down can safely proceed with the NV portions along word line WL0 having the relevant data upon entering power-down, and NV portion 60 also being programmed to the state which results in node 76 obtaining a logic high coming out of power-down. Coming out of power-down may be referenced as a power-up.

In coming out of power-down, NV store word line signal NVSWL0 and volatile write word line signal VWWL0 will both be a logic low and inverters 72 and 70 will be powered. Controller 12 provides latch backup signal LB at a logic high which causes transistors 66 and 68 to be conductive. The relatively high resistance of programmable resistance 64 will result in node 76 rising to a higher voltage than node 74 which results in latch 56 flipping to the state in which node 76 is a logic high and node 74 is a logic low. Buffer 58 thus provides word line register signal WL0R to be a logic high which indicates that the NV portions of word line WL0 have the most recent data. Controller 12 then directs NVRAM 14 to perform a restore in which data present in the NV portions is loaded into the RAM portions. The same process is followed for the other word lines as well with their corresponding NV latches. The result is the data present in the NVM portions of word lines where the store function was successful immediately prior to the power-down is valid.

In the case where the store operation on word line WL0 immediately prior to the power-down is either not successful or not attempted, controller 12 does not assert NV store word line signal NVSWL0 so that word line register signal WL0R does not change to a logic high but remains at a logic low to indicate that the data in the NV portions was not updated to the most recent data in the RAM portions. Thus, when power is returned, word line register signal WL0R is read by controller 12 and the restore function is not performed on word line WL0.

NV latch 52 matches NV latch 50 except that it is for word line WL1. Thus, for example, NV store word line NVSWL0 of NV latch 50 would be NV store word line NVSWL1 received from controller 12 and would indicate that a store has been successful for word line WL1 when asserted as a logic high. Similarly, volatile write word line signal VWWL0 would be volatile write word line signal VWWL1 for NV latch 52 indicating that RAM portions along word line WL1 had been written. As another example, word line register signal WL0R of FIG. 2 would be word line register signal WL1R for NV latch 52. In either case, the word line register signal is an indicator signal indicating if the most recent data has been written into the volatile portions for its corresponding word line.

This capability makes it useful to attempt a store function for even an unscheduled power-down, such as a power loss, because knowledge of the success or failure of the pre-power-down store operation will be known by accessing the word line register signal when power is restored.

This type of operation can also be used for refresh for the case of the RAM portions being DRAM cells which need periodic refreshing. Memory system 10 may have a special mode for refresh in which refresh will not occur unless the data in the RAM portion has changed from the NV portion which would have the effect of saving power as well as not requiring the time to perform the refresh. If a DRAM cell is simply refreshed, there is no change in the data. A low power mode can be entered in which refresh only occurs if the data in the DRAM cell is different from its corresponding NV portion. In the same way as volatile write word line signal VWWL0 is generated by NVRAM 14, an analogous signal, on a column basis instead of the row basis of memory system 10, is generated to indicate that the data to be refreshed is different than data in the corresponding NV portion and refresh is then performed. At such time as the data in the DRAM cells along a column is stored into their corresponding NV portions, then a signal analogous to NV store word line NVSWL0, but on a column basis, is generated by the controller to indicate that the data in the NV portions along the column is the same as the data in the DRAM cells. In such case refresh need not occur. At such time as the data needs to be in the DRAM cells, a restore operation is performed which loads the data in the NVM portions into the DRAM cells.

By now it should be appreciated that there has been disclosed a memory system having a a first plurality of non-volatile random access memory (NVRAM) cells and a non-volatile indicator circuit. The first plurality of NVRAM cells has a further characterization by which each NVRAM cell has a volatile portion coupled to a corresponding non-volatile portion. The non-volatile indicator circuit is further characterized by providing information as to whether the first plurality of NVRAM cells has the most recent data written into NVRAM cells in the non-volatile portions. The memory system may further include a memory controller coupled to the first plurality of NVRAM cells and the non-volatile indicator circuit. The memory system may have a further characterization by which the memory controller monitors the first plurality of NVRAM cells and updates the non-volatile indicator circuit. The memory system may have a further characterization by which, in response to a power-down of the memory system and the non-volatile indicator circuit indicating that the first plurality of NVRAM cells does not have the most recent data written into the first plurality NVRAM cells in the non-volatile portions, the memory controller directs the first plurality of NVRAM cells to transfer data present in each volatile portion to its corresponding non-volatile portion. The memory system may have a further characterization by which the non-volatile indicator circuit may further include an indicator non-volatile portion, a transfer circuit coupled to the indicator non-volatile portion, and a latch coupled to the transfer circuit, wherein the latch provides the information if the first plurality of NVRAM cells has the most recent data written into the first plurality of NVRAM cells in the non-volatile portions. The memory system may have a further characterization by which the latch provides the information with an indicator signal. The memory system may have a further characterization by which, in response to a power up of the memory system, the memory controller directs the first plurality of NVRAM cells to load data present in each of the non-volatile portions into the corresponding volatile portions if the non-volatile indicator circuit indicates that the most recent data had been written into the non-volatile portion of all of the first plurality NVRAM cells of the block. The memory system may have a further characterization by which the non-volatile indicator circuit may include an indicator non-volatile portion, a transfer circuit coupled to the indicator non-volatile portion, and a latch coupled to the transfer circuit. The memory system may have a further characterization by which, in response to the power up, the memory controller directs the non-volatile indicator circuit to couple data stored in the indicator non-volatile portion to the latch through the transfer circuit. The memory system may further include a second plurality of NVRAM cells, wherein each NVRAM cell has a volatile portion coupled to a corresponding non-volatile portion, wherein the non-volatile indicator circuit further provides information indicating that the second plurality of NVRAM cells has the most recent data written into NVRAM cells in the non-volatile portions.

Also disclosed is a method of operating a memory system having a first plurality of non-volatile memory random access memory (NVRAM) cells, wherein each NVRAM cell comprises a non-volatile portion and a volatile portion. The method includes determining if each non-volatile portion has the most recent data provided to the first plurality of NVRAM cells. The method includes using a non-volatile memory (NVM) indicator circuit to output a signal indicating if the most recent data provided to the first plurality of NVRAM cells is present in each of the non-volatile portions. The method may further include, in a power-up mode of the memory system, using the NVM indicator circuit to determine if each non-volatile portion of the first plurality of NVRAM cells has the most recent data, and, if each non-volatile portion of the first plurality of NVRAM cells has the most recent data, transferring data from each non-volatile portion to its corresponding volatile portion. The method may further include, in a mode comprising one of group consisting of power-down and refresh, transferring data from each volatile portion to each corresponding non-volatile portion if the NVM indicator circuit indicates that each non-volatile portion has the most recent data. The method may further include, in the mode comprising one of a group consisting of refresh and power up, not transferring data from each volatile portion to each corresponding volatile portion if the NVM indicator circuit indicates that each NVM portion does not have the most recent data. The method may have a further characterization by which the using a non-volatile memory (NVM) indicator circuit to output an indicator signal is further characterized by the signal being a first logic state to indicate if the most recent data provided to the first plurality of NVRAM cells is present in each of the non-volatile portions and a second logic state to indicate that the most recent data provided to the first plurality of NVRAM cells is not present in each of the non-volatile portions, and may further include, in response to writing data into the volatile portion of a NVRAM cell of the first plurality of NVRAM cells when the indicator signal is in the first logic state, switching the indicator signal to the second logic state. The method may have a further characterization by which the memory system further comprises a second plurality of NVRAM cells and each NVRAM cell of the second plurality of NVRAM cells comprises a non-volatile portion and a volatile portion and may further include, in a power up mode of the memory system, using the NVM indicator circuit to determine if each non-volatile portion of the second plurality of NVRAM cells has the most recent data and, if each non-volatile portion of the second plurality of NVRAM cells has the most recent data, transferring data from each non-volatile portion to its corresponding volatile portion. The method may further include, in a mode comprising one of group consisting of power-down and refresh, transferring data from each volatile portion of the second plurality of NVRAM cells to each corresponding non-volatile portion if the NVM indicator circuit indicates that each non-volatile portion of the second plurality of NVRAM cells has the most recent data.

Disclosed also is a memory system including a plurality of non-volatile random access memory (NVRAM) cells, wherein each NVRAM cell has a volatile portion coupled to a corresponding non-volatile portion. The memory system further includes a non-volatile indicator circuit that provides information as to whether the first plurality of NVRAM cells has the most recent data written into NVRAM cells in the non-volatile portions, if most recent data written in the NVRAM cells is in the non-volatile portions, providing an indicator output at a first logic state and if the most recent data written in the NVRAM is not in the non-volatile portions, providing the indicator output at a second logic state. The memory system may further include a memory controller, wherein, if the logic state of the indicator output is in the first logic state, the memory controller directs the first plurality of NVRAM cells to transfer data in the volatile portions to the non-volatile portions in response to entering one of a group consisting of a refresh mode and a power-down mode. The memory system may further include a memory controller, wherein if the logic state of the indicator output is in the first logic state, the system controller directs the first plurality of NVRAM cells to transfer the data in the non-volatile portions to the volatile portions in response to entering a power up mode.

Although the invention is described herein with reference to specific embodiments, various modifications and changes can be made without departing from the scope of the present invention as set forth in the claims below. For example, the particular type of non-volatile element can vary from that of an MTJ and the RAM element may vary from being a static RAM. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory system, comprising;
   a first plurality of non-volatile random access memory (NVRAM) cells, wherein each NVRAM cell has a volatile portion coupled to a corresponding non-volatile portion;
   a non-volatile indicator circuit that provides information as to whether the first plurality of NVRAM cells has the most recent data written into NVRAM cells in the non-volatile portions; and
   a memory controller coupled to the first plurality of NVRAM cells and the non-volatile indicator circuit;
   wherein, in response to a power up of the memory system, the memory controller directs the first plurality of NVRAM cells to load data present in each of the non-volatile portions into the corresponding volatile portions if the non-volatile indicator circuit indicates that the most recent data had been written into the non-volatile portion of all of the first plurality NVRAM cells of the block.

2. The memory system of claim 1, wherein the memory controller monitors the first plurality of NVRAM cells and updates the non-volatile indicator circuit.

3. The memory system of claim 2, wherein, in response to a power-down of the memory system and the non-volatile indicator circuit indicating that the first plurality of NVRAM cells does not have the most recent data written into the first plurality NVRAM cells in the non-volatile portions, the memory controller directs the first plurality of NVRAM cells to transfer data present in each volatile portion to its corresponding non-volatile portion.

4. The memory of claim 1, wherein the non-volatile indicator circuit comprises:
   an indicator non-volatile portion;
   a transfer circuit coupled to the indicator non-volatile portion; and
   a latch coupled to the transfer circuit, wherein the latch provides the information if the first plurality of NVRAM cells has the most recent data written into the first plurality of NVRAM cells in the non-volatile portions.

5. The memory system of claim 4, wherein the latch provides the information with an indicator signal.

6. The memory system of claim 1, wherein, the non-volatile indicator circuit comprises:
   an indicator non-volatile portion;
   a transfer circuit coupled to the indicator non-volatile portion; and
   a latch coupled to the transfer circuit.

7. The memory system of claim 6, wherein, in response to the power up, the memory controller directs the non-volatile indicator circuit to couple data stored in the indicator non-volatile portion to the latch through the transfer circuit.

8. The memory system of claim 7, further comprising,
   a second plurality of NVRAM cells, wherein each NVRAM cell has a volatile portion coupled to a corresponding non-volatile portion;
   wherein:
   the non-volatile indicator circuit further provides information indicating that the second plurality of NVRAM cells has the most recent data written into NVRAM cells in the non-volatile portions.

9. A method of operating a memory system having a first plurality of non-volatile memory random access memory (NVRAM) cells, wherein each NVRAM cell comprises a non-volatile portion and a volatile portion, comprising:
   determining if each non-volatile portion has the most recent data provided to the first plurality of NVRAM cells;
   using a non-volatile memory (NVM) indicator circuit to output a signal indicating if the most recent data provided to the first plurality of NVRAM cells is present in each of the non-volatile portions;
   in a power-up mode of the memory system, using the NVM indicator circuit to determine if each non-volatile portion of the first plurality of NVRAM cells has the most recent data; and if each non-volatile portion of the first plurality of NVRAM cells has the most recent data, transferring data from each non-volatile portion to its corresponding volatile portion.

10. The method of claim 9, further comprising:
in a mode comprising one of group consisting of power-down and refresh, transferring data from each volatile portion to each corresponding non-volatile portion if the NVM indicator circuit indicates that each non-volatile portion has the most recent data.

11. The method of claim 10, further comprising:
in the mode comprising one of a group consisting of refresh and power up, not transferring data from each volatile portion to each corresponding volatile portion if the NVM indicator circuit indicates that each NVM portion does not have the most recent data.

12. The method of claim 9,
wherein the using a non-volatile memory (NVM) indicator circuit to output an indicator signal is further characterized by the signal being a first logic state to indicate if the most recent data provided to the first plurality of NVRAM cells is present in each of the non-volatile portions and a second logic state to indicate that the most recent data provided to the first plurality of NVRAM cells is not present in each of the non-volatile portions,
further comprising:
in response to writing data into the volatile portion of a NVRAM cell of the first plurality of NVRAM cells when the indicator signal is in the first logic state, switching the indicator signal to the second logic state.

13. The method of claim 9, wherein the memory system further comprises a second plurality of NVRAM cells and each NVRAM cell of the second plurality of NVRAM cells comprises a non-volatile portion and a volatile portion, further comprising:
in a power up mode of the memory system, using the NVM indicator circuit to determine if each non-volatile portion of the second plurality of NVRAM cells has the most recent data; and
if each non-volatile portion of the second plurality of NVRAM cells has the most recent data, transferring data from each non-volatile portion to its corresponding volatile portion.

14. The method of claim 13, further comprising:
in a mode comprising one of group consisting of power-down and refresh, transferring data from each volatile portion of the second plurality of NVRAM cells to each corresponding non-volatile portion if the NVM indicator circuit indicates that each non-volatile portion of the second plurality of NVRAM cells has the most recent data.

15. A memory system, comprising;
a plurality of non-volatile random access memory (NVRAM) cells, wherein each NVRAM cell has a volatile portion coupled to a corresponding non-volatile portion;
a non-volatile indicator circuit that provides information as to whether the first plurality of NVRAM cells has the most recent data written into NVRAM cells in the non-volatile portions, if most recent data written in the NVRAM cells is in the non-volatile portions, providing an indicator output at a first logic state and if the most recent data written in the NVRAM is not in the non-volatile portions, providing the indicator output at a second logic state; and
a memory controller, wherein if the logic state of the indicator output is in the first logic state, the system controller directs the first plurality of NVRAM cells to transfer the data in the non-volatile portions to the volatile portions in response to entering a power up mode.

16. The memory system of claim 15, further comprising a memory controller, wherein, if the logic state of the indicator output is in the first logic state, the memory controller directs the first plurality of NVRAM cells to transfer data in the volatile portions to the non-volatile portions in response to entering one of a group consisting of a refresh mode and a power-down mode.

* * * * *